United States Patent [19]

Cohn

[11] Patent Number: 4,916,522

[45] Date of Patent: Apr. 10, 1990

[54] INTEGRATED CIRCUIT PACKAGE USING PLASTIC ENCAPSULANT

[75] Inventor: Charles Cohn, Wayne, N.J.

[73] Assignee: American Telephone and Telegraph Company, AT & T Bell Laboratories, Murray Hill, N.J.

[21] Appl. No.: 184,214

[22] Filed: Apr. 21, 1988

[51] Int. Cl.⁴ .................... H01L 21/56; H05K 5/06
[52] U.S. Cl. ........................... 357/72; 357/74; 357/80
[58] Field of Search ............. 437/219, 206; 361/386; 357/72, 74, 80

[56] References Cited

U.S. PATENT DOCUMENTS

| | | | |
|---|---|---|---|
| 3,906,144 | 9/1975 | Wiley | 357/72 |
| 3,909,838 | 9/1975 | Beyerlein | 357/72 |
| 3,940,786 | 2/1976 | Scheingold et al. | 357/68 |
| 3,959,874 | 6/1976 | Coucoulas | 357/72 |
| 4,100,675 | 7/1978 | Landsittel | 437/206 |
| 4,616,406 | 10/1986 | Brown | 357/68 |
| 4,658,331 | 4/1987 | Berg | 361/386 |
| 4,778,641 | 10/1988 | Chia | 437/219 |
| 4,791,075 | 12/1988 | Lin | 437/215 |

FOREIGN PATENT DOCUMENTS

| | | | |
|---|---|---|---|
| 0106872 | 3/1978 | Japan | 357/68 |
| 0210858 | 10/1985 | Japan | 357/68 |
| 0023346 | 1/1986 | Japan | 357/22 |
| 0029158 | 2/1986 | Japan | 357/72 |
| 0079237 | 4/1986 | Japan . | |

Primary Examiner—Andrew J. James
Assistant Examiner—Viet Q. Nguyen
Attorney, Agent, or Firm—Peter A. Businger

[57] ABSTRACT

An integrated circuit package uses an encapsulant frame which prevents the encapsulant used to seal the integrated circuit chip from the ambient atmosphere from flowing to unwanted areas and to permit the encapsulant to be deposited with a controllable depth.

4 Claims, 1 Drawing Sheet

INTEGRATED CIRCUIT PACKAGE USING PLASTIC ENCAPSULANT

TECHNICAL FIELD

This invention relates to integrated circuit packages using an encapsulant to protect the integrated circuit chip.

BACKGROUND OF THE INVENTION

Although most attention in integrated circuit manufacturing is presently focused on the steps required to fabricate an integrated circuit chip, the assembly of various components, including the chip, into a package is a commercially significant process. After fabrication of the integrated circuit chip has been completed, the chip must be mounted on an underlying material so that it can be expediently handled as well as electrically contacted. One technique mounts the chip directly on a printed circuit board. A printed circuit board typically is a dielectric material having a metallic pattern on at least one major surface with selected portins of the pattern being electrically contacted to appropriate portions of the chip. Another technique mounts the chip within a plastic package cavity which in turn is mounted on, e.g., a printed circuit mother board. However, both mounting techniques typically use some approach to protect the chip from adverse effects, i.e., to seal the chip from the ambient atmosphere. A ceramic could also be used as the underlying material.

One such approach uses a glob of epoxy over the chip. Another approach uses a plastic cap which is cemented over the chip. Both approaches, unfortunately, have drawbacks. For example, the disadvantages of the epoxy glob include a tendency of the epoxy to spread irregularly over the surface surrounding the chip, i.e., the epoxy flows and neither the direction nor extent of the flow can be precisely controlled. Additionally, as will be readily appreciated, the thickness of the epoxy over the chip cannot be precisely controlled. The use of a plastic cap avoids both of these drawbacks but is, unfortunately, costlier to implement than is the epoxy glob due to the nature of the assembly step required. Additionally, the cap should be leak tested after it is cemented in place to insure that deleterious contaminants will not enter the cap and damage the chip because there is not a tight seal between the cap and the underlying material.

SUMMARY OF THE INVENTION

An integrated circuit package having a mounting plate having a plurality of recesses; an integrated circuit chip mounted on said plate and electrically contacted to selected portions of said plate; a frame having a plurality of retention pins, said frame being mounted on said plate with said retention pins in said recesses and encircling said chip; and an encapsulant in said frame thereby sealing said chip from the ambient atmosphere. The mounting plate may be a printed circuit board or a ceramic substrate.

DETAILED DESCRIPTION

Figure 1:
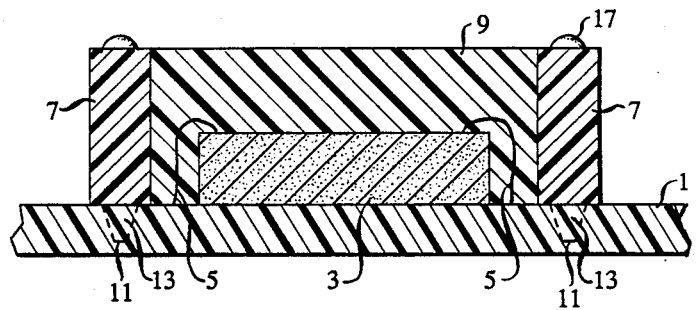
FIG. 1 is a sectional view of an integrated circuit package according to this invention.

An exemplary package is shown in the sectional view in FIG. 1. For reasons of clarity, the elements of the package are not drawn to scale. Depicted are a mounting plate 1; an integrated circuit chip 3; a plurality of electrical leads 5 between said mounting plate and said chip; and an encapsulant frame 7. Within the encapsulant frame is an encapsulant 9. The mounting plate has a plurality of recesses 11 and the frame has a plurality of retention pins 13 which mate with said recesses. Typical mounting plates are printed circuit boards or ceramic substrates.

After attaching and wire bonding the chip to, e.g., a printed circuit board using well known techniques, the encapsulant frame is mounted on the printed circuit board using techniques well known to those skilled in the art and the encapsulant, e.g., liquid epoxy, is dispensed over the chip until it is approximately level with the top of the frame or until the chip has been appropriately sealed from the atmosphere.

Accurate positioning of the encapsulant frame on the printed circuit board is facilitated by the plurality of recesses on the board adapted to receive, i.e., mate with, the plurality of retention pins on the encapsulant frame.

On the side of the frame opposed to the retention pins, there will desirably be plurality of bumps which allow for an air gap between the encapsulant and the other board on which the package is mounted. The package is mounted with the chip and the encapsulant surface facing the board. The air gap, because of the spacing caused by the bumps, facilitates cleaning underneath the package if that becomes necessary.

The material used for the frame is not critical and one skilled in the art will readily be able to select an appropriate material. An exemplary material is a high temperature plastic such as polyphenylene sulfide.

Figure 2:
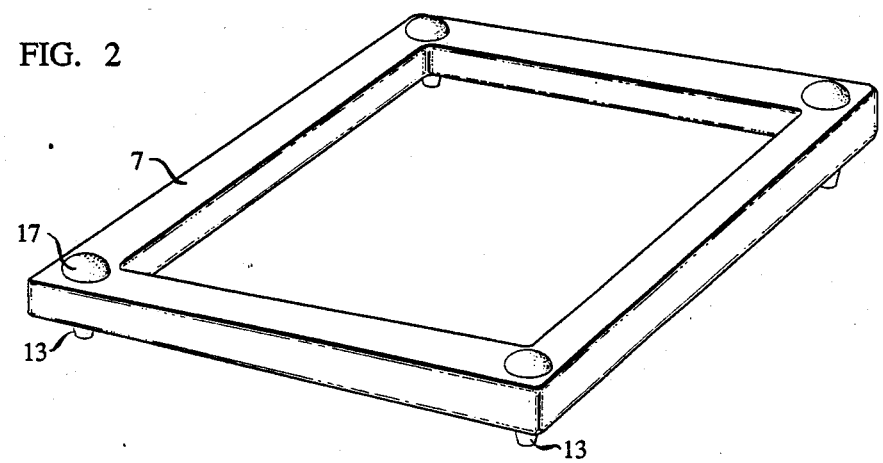
FIG. 2 is a perspective view of an exemplary plastic frame according to this invention.

FIG. 2 is a perspective view of a plastic frame according to this invention showing the plurality of retention pins 13 and a plurality of spherical bumps 17 depicted.

What is claimed is:

1. An integrated circuit package comprising a mounting plate having a plurality of plate-surface recesses, and a metallic pattern on said mounting plate between said recesses;

an integrated circuit chip mounted on said plate between said recesses;

a plurality of electrical leads from said chip to said metallic pattern;

an encapsulant frame encircling said chip and said metallic pattern, and having a plurality of retention pins in said recesses; and an encapsulant disposed within said encapsulant frame sealing said chip, said electrical leads, and said metallic pattern from the ambient atmosphere.

2. A package as recited in claim 1 in which a circuit board serves as said mounting plate.

3. A package as recited in claim 1 in which said mounting plate comprises a ceramic substrate.

4. A package as recited in claim 1 in which said encapsulant has a surface approximately level with the surface of said frame.

* * * * *